(12) United States Patent
Stahl et al.

(10) Patent No.: US 9,725,300 B2
(45) Date of Patent: Aug. 8, 2017

(54) CAPACITIVE MEMS-SENSOR ELEMENT HAVING BOND PADS FOR THE ELECTRICAL CONTACTING OF THE MEASURING CAPACITOR ELECTRODES

(71) Applicant: Robert Bosch GmbH, Stuttgart (DE)

(72) Inventors: Heiko Stahl, Reutlingen (DE); Arnim Hoechst, Reutlingen (DE); Bernhard Gehl, Wannweil (DE); Rolf Scheben, Reutlingen (DE); Benedikt Stein, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/059,630

(22) Filed: Mar. 3, 2016

(65) Prior Publication Data

US 2016/0280534 A1   Sep. 29, 2016

(30) Foreign Application Priority Data

Mar. 25, 2015   (DE) .......................... 10 2015 205 384

(51) Int. Cl.
  *H01L 29/84*   (2006.01)
  *B81B 3/00*   (2006.01)
(52) U.S. Cl.
  CPC .... *B81B 3/0086* (2013.01); *B81B 2201/0257* (2013.01); *B81B 2203/0127* (2013.01); *B81B 2203/04* (2013.01)
(58) Field of Classification Search
  CPC .............. B81B 3/0086; B81B 2203/04; B81B 2201/0257; B81B 2203/0127;
  (Continued)

(56) References Cited

U.S. PATENT DOCUMENTS 9,165,793 B1 * 10/2015 Wang ....................... H01L 21/56
2014/0175572 A1 * 6/2014 Hsu ....................... B81B 3/0086
  257/415

OTHER PUBLICATIONS

"Design on the Low-Capacitance Bond Pad for High-Frequency I/O Circuits in CMOS Technology", IEEE Transactions on Electron Devices, vol. 48, No. 12, Dec. 2001, pp. 2953-2956.

* cited by examiner

*Primary Examiner* — Thanh Y Tran
(74) *Attorney, Agent, or Firm* — Norton Rose Fulbright US LLP; Gerard Messina

(57) ABSTRACT

Measures for reducing parasitic capacitances in the layer structure of capacitive MEMS sensor elements, in which parasitic capacitances between bond pads for electrically contacting measuring capacitor electrodes and an electrically conductive layer lying underneath are reduced by these measures. The sensor structure having the measuring capacitor electrodes and bond pads of such MEMS components are in a layer structure on a semiconductor substrate. The carrier layer directly underneath the bond pad structure is uninterrupted in the bond pad region, and the layer structure includes at least one insulation layer by which at least one of the bond pads is electrically insulated from an electrically conductive layer lying underneath. At least one layer under the carrier layer is structured in the region of this bond pad, so that hollow spaces are situated in the layer structure underneath this bond pad, by which the parasitic capacitance between this bond pad and the conductive layer lying underneath is reduced. Alternatively/additionally, the material of the conductive layer in the region underneath this bond pad is replaced by electrically conductive material at least in the upper layer region, so that the insulation layer in the region of this bond pad is considerably thicker than outside the bond pad region.

18 Claims, 4 Drawing Sheets

(58) Field of Classification Search
CPC .......... B81B 2201/0264; B81B 7/0003; B81B 7/0048; B81B 7/02; B81B 2201/02; H01L 2924/1461; H01L 2924/30105
See application file for complete search history.

CAPACITIVE MEMS-SENSOR ELEMENT HAVING BOND PADS FOR THE ELECTRICAL CONTACTING OF THE MEASURING CAPACITOR ELECTRODES

RELATED APPLICATION INFORMATION

The present application claims priority to and the benefit of German patent application no. 10 2015 205 384.9, which was filed in Germany on Mar. 25, 2015, the disclosure of which is incorporated herein by reference.

FIELD OF THE INVENTION

The present invention relates to a capacitive MEMS sensor element such as a capacitive pressure sensor element or a capacitive microphone component, whose measuring capacitor electrodes are electrically contacted via bond pads in the component topside. The sensor structure having the measuring capacitor electrodes and the bond pads is realized in a layer configuration on a semiconductor substrate. The carrier layer directly underneath the bond pad structure is uninterrupted. The layer structure includes at least one insulation layer by which at least one of the bond pads is electrically insulated from an electrically conductive layer situated underneath. This at least one insulation layer may function as carrier layer for the bond pad structure. However, it may also be at least one further layer of the layer structure between carrier layer and electrically conductive layer. The electrically conductive layer may be the semiconductor substrate of the MEMS sensor element or also a functional layer of the MEMS layer structure, such as a diaphragm layer, for instance.

BACKGROUND INFORMATION

The sensor structure of such a capacitive MEMS sensor element normally includes a deflectable structured element, such as a diaphragm or a bending beam, and a stationary counter element, which are provided with an electrode of a measuring capacitor in each case. The deflectable structured element is deflected by the measured variable to be detected, e.g., the effect of force, pressure or sound, relative to the stationary counter element. The distance between the measuring capacitor electrodes changes in the process. The capacitance of the measuring capacitor changes accordingly as well. This change in capacitance forms the basis of the electrical sensor output signal.

In practice, however, the sensor output signal is defined not only by the measured variable and the geometrical and electrical characteristics of the measuring capacitor system, but also by parasitic capacitances in the layer structure of the MEMS sensor element and, in particular, by parasitic capacitances that arise between the bond pads for the electrical contacting of the measuring capacitor electrodes and further electrically conductive layers of the layer structure. Since the highest degree of linearity possible between the measured variable to be detected and the sensor output signal is desired in most sensor applications, these parasitic capacitances should be kept to a minimum.

In the Article "Design on the Low-Capacitance Bond Pad for High-Frequency I/O Circuits in CMOS Technology", IEEE Transactions on Electron Devices, Vol. 48, No 12, December 2001, pages 2953-2956, measures aimed at reducing the parasitic capacitance between a bond pad in the bad end stack of a CMOS component and the CMOS substrate are described. Here, the bond pad is realized in the form of multiple metallization planes situated on top of one another, which are electrically interconnected via so-called via plugs. The via plugs bridge the insulation layers between the individual metallization planes, so that the bond pad structure is practically interlocked with the layer structure of the back end stack. This configuration gives the bond pad the stability and tensile strength required for the wire bonding process. The magnitude of the parasitic capacitance between such a bond pad and the CMOS substrate is essentially defined by the clearance between the substrate and the lowest metallization plane and by the area size of the lowest metallization plane, which essentially corresponds to the electrode surface of the parasitic capacitance. In the approach described here, the parasitic capacitance is to be reduced by making the electrode surface smaller. To do so, the lower metallization planes are structured, so that the excellent interlocking with the back end stack is maintained. In this case the parasitic capacitance is reduced approximately according to the functional relationship between capacitance C and electrode surface A of a plate-type capacitor.

$$C = \epsilon_0 \epsilon_r \cdot A/d,$$

$\epsilon_0$ denoting the electrical field constant, $\epsilon_r$ describing the relative permittivity of the dielectric between the capacitor electrodes, and d denoting the electrode clearance.

SUMMARY OF THE INVENTION

The present invention proposes measures for reducing parasitic capacitances in the layer structure of capacitive MEMS sensor elements. These measures in particular are aimed at reducing the parasitic capacitances between the bond pads for the electrical contacting of the measuring capacitor electrodes and an electrically conductive layer situated underneath.

In contrast to the related art cited above, the measures of the present invention are not aimed at structuring the metallization surface of the bond pads and at reducing them in this way. Instead, the measures of the present invention are meant to allow a dielectric having the lowest dielectric constant $\epsilon_r$ possible to be used for the electrical insulation of the bond pads and/or for reducing the electrode surface A of the electrically conductive layer situated underneath the bond pad, and/or for enlarging distance d between the bond pad and the electrically conductive layer lying underneath.

According to the exemplary embodiment, this is achieved in that at least one layer underneath the carrier layer is structured in the region of at least one bond pad, so that hollow spaces are situated underneath this bond pad in the layer structure, by which the parasitic capacitance between this bond pad and the electrically conductive layer situated underneath is reduced.

This is so because it was recognized according to the present invention that the relative permittivities of the materials normally used for insulation layers, such as silicon oxide, for example, are frequently greater than 1 and thus also greater than the relative permittivity of air. Accordingly, the creation of hollow spaces reduces the relative permittivity of an insulation layer, and therefore also the parasitic capacitance between the bond pad and the electrically conductive layer situated underneath.

In addition or as an alternative to an insulation layer between the carrier layer and the electrically conductive layer, it is also possible according to the present invention to pattern the electrically conductive layer itself. This makes it possible to reduce the electrode surface of the conductive layer, which likewise leads to a reduction of the parasitic capacitance.

In one specific embodiment of the present invention, at least two layers underneath the carrier layer are structured in different rasters and/or at an offset from each other in the bond pad region, so that the resulting hollow spaces in these layers are situated at a lateral offset from each other. This configuration is characterized not only by a particularly low parasitic capacitance between the bond pad and the electrically conductive layer lying underneath. Given a suitable size, form and placement of the hollow spaces within the layers, it is also possible to achieve high stability and pressure resistance in the bond pad region, which is of the utmost importance for the wire bonding process.

According to the one of the embodiments, the parasitic capacitance between a bond pad and an electrically conductive layer lying underneath is reduced by replacing the material of the electrically conductive layer in the region underneath this bond pad by electrically insulating material at least in the upper layer region, so that the insulation layer in the region of these bond pads has a considerably thicker design than outside the bond pad region.

It was recognized according to the present invention that this measure makes it possible to enlarge distance d between the bond pad and the electrically conductive layer lying underneath without increasing the layer structure overall.

If the distance between a bond pad and the semiconductor substrate lying underneath is to be enlarged, then the substrate material in an upper layer region can initially be simply structured, or it may be etched so as to be porous in order to then be converted into an electrically insulating oxide material in an oxidation process.

As already mentioned earlier, there are various possibilities for further developing and further refining the teaching of the present invention in an advantageous manner. In this connection reference is made to the further descriptions on the one hand and to the following description of a plurality of exemplary embodiments of the present invention on the other.

DETAILED DESCRIPTION

Figure 1:
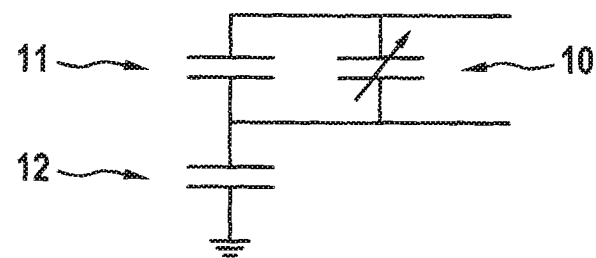
FIG. 1 shows the circuit diagram of a capacitive microphone component having a microphone capacitor and two parasitic capacitances in the component structure.

The circuit diagram of FIG. 1 illustrates that the configuration of a capacitive MEMS microphone element invariably includes not only microphone capacitor 10 but also so-called parasitic capacitances 11 and 12. Such parasitic capacitances are inevitably generated within the layer structure of such a component, i.e., between electrically conductive layers that are electrically separated from each other by one or more insulation layer(s) and lie at different electrical potentials. The parasitic capacitances influence the capacitive signal acquisition and should therefore be kept to a minimum.

Figure 2:
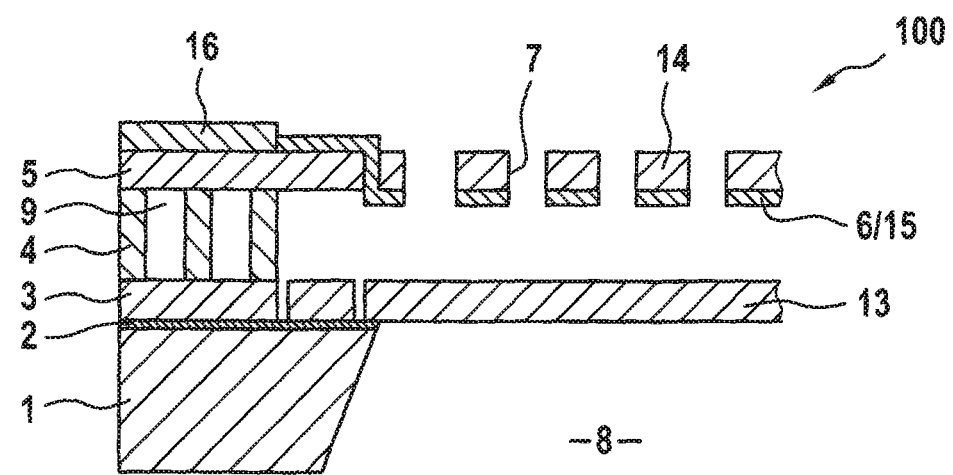
FIG. 2 shows a schematic sectional view through a portion of the layer structure of a first capacitive MEMS microphone component 100 having a structured insulation layer between the bond pad and diaphragm layer situated underneath.

The microphone structure of microphone element 100 shown in FIG. 2 is realized in a layer structure on a semiconductor substrate 1 and includes a diaphragm 13 which is sensitive to sound pressure, and an acoustically permeable stationary counter element 14. Diaphragm 13 is formed in an electrically conductive diaphragm layer 3, so that diaphragm 13 itself acts as a deflectable electrode of a microphone capacitor for a signal acquisition. It spans an opening 8 in the substrate rear side. Diaphragm layer 3 is electrically insulated from substrate 1 by a first insulation layer 2 and from a layer 5, which is relatively thick in comparison and in which counter element 14 is formed, by a second, considerably thicker insulation layer 4. Insulation layer 4 was removed in the region above diaphragm 13, so that diaphragm 13 is deflectable both in the upward and downward direction. Through openings 7 for pressure equalization are formed in counter element 14. In this case, counter element 14 is used as carrier for a stationary counter electrode 15 of the microphone capacitor, which is realized in the form of an electrically conductive layer 6 on the underside of counter element 1. This counter electrode 15 is electrically contacted via a bond pad 16, which is disposed on the side next to the microphone structure on the component top surface and is realized in the form of a surface metallization in this instance. Layer 5 forms a carrier layer for bond pad 16 that is uninterrupted in the bond pad region. A parasitic capacitance exists between bond pad 16 and electrically conductive diaphragm layer 13 lying underneath, which has been reduced here according to the present invention by structuring insulation layer 4 in the bond pad region. The material of insulation layer 4 was partially removed, so that hollow spaces 9 were created. The air within hollow spaces 9 has a lower relative permittivity than the material of insulation layer 4, so that the parasitic capacitance in the bond pad region is reduced by hollow spaces 9. It should be noted at this point that a gas other than air or a vacuum may be enclosed within these hollow spaces. In these cases, as well, the relative permittivity is reduced in comparison with the relative permittivity of the material of insulation layer 4.

However, when structuring individual layers of the layer structure in order to create hollow spaces underneath a bond pad, as shown in FIG. 2, it must be ensured that the layer structure still remains sufficiently stable for the wire bonding process for the contacting of the components.

Figure 3A:
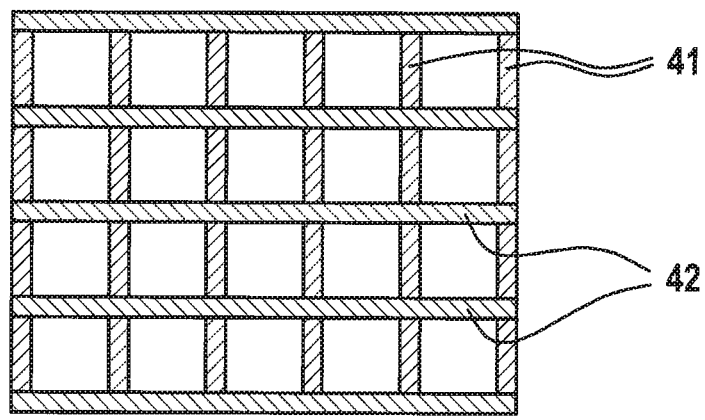
FIGS. 3a and 3b show a plan view of the layer stack of two differently structured insulation layers.
Figure 3B:
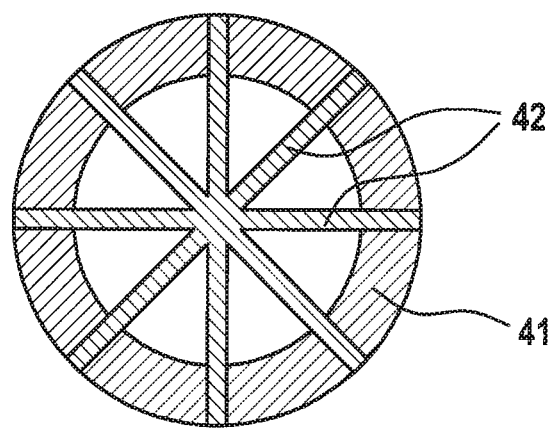

FIGS. 3a and 3b illustrate the manner in which a very stable understructure for a bond pad can be created, yet a large portion of the layer material of the insulation layer is able to be removed. For insulation layer 4 is formed by two layers 41 and 42 in each case here, which were patterned differently. In the case of FIG. 3a, webs disposed in parallel were patterned out of lower insulation layer 41, which extend across the entire bond pad region. Such webs disposed in parallel were also patterned out of superposed insulation layer 42. However, these are oriented at a right angle to the webs of insulation layer 41, which gives the two layers a very high pressure resistance overall. In the case of FIG. 3b, an annular structure was patterned out of lower insulation layer 41, while a star-shaped system of webs was patterned out of insulation layer 42, which spans the annular structure of insulation layer 41.

Figure 4:
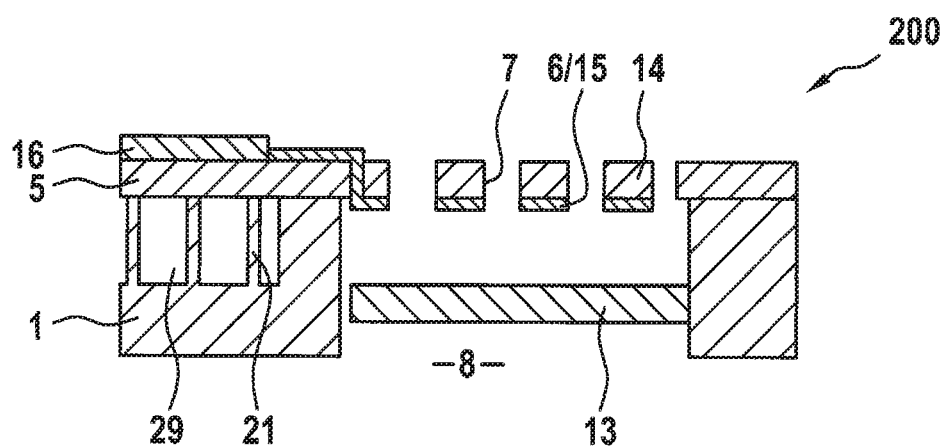
FIG. 4 shows a schematic sectional view through a portion of the layer structure of a second capacitive MEMS microphone component 200 having a structured semiconductor substrate in the bond pad region.

The component structure of microphone component 200 shown in FIG. 4 is realized in a layer structure on a semiconductor substrate 1, as well. It likewise includes a diaphragm 13 sensitive to sound pressure, and an acoustically permeable stationary counter element 14. Diaphragm 13 spans an opening 8 in the substrate rear side. It is made of an electrically conductive layer material and functions as deflectable electrode of a microphone capacitor. Counter element 14 with through openings 7 is realized in a relatively thick insulation layer 5 on component substrate 1. Here, too, stationary counter electrode 15 of the microphone capacitor is formed in an electrically conductive layer 6 on the underside of counter element 14 and is electrically contacted via a bond pad 16 on the component top surface. A parasitic capacitance exits between the surface metallization of bond pad 16 and semiconductor substrate 1 lying underneath. It was reduced in the exemplary embodiment described here, by patterning semiconductor substrate 1 in the bond pad region. Column-type or web-type support elements 21 were exposed in semiconductor substrate 1 in the process, next to which uninterrupted insulation layer 5 having bond pads 16 extends. The substrate surface abutting insulation layer 5, which as electrode surface A has significance for the magnitude of the parasitic capacitance, thus is clearly reduced here. The column- or web-like support elements 21 are dimensioned and placed in such a way that they provide the layer structure in the bond pad region with the stability required for the wire bonding process, despite the fact that hollow cavities 29 were created in semiconductor substrate 1 by the structuring.

Figure 5:
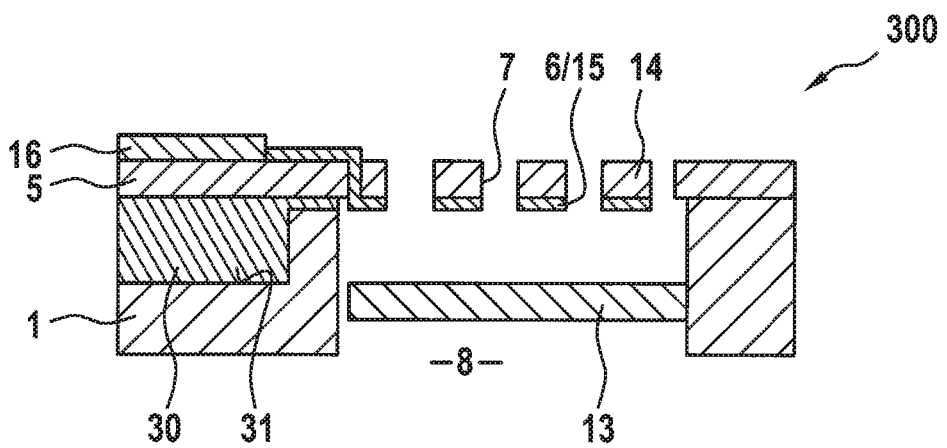
FIG. 5 shows a schematic sectional view through a portion of the layer structure of a third capacitive MEMS microphone element 300 having an enlarged distance between bond pad and semiconductor substrate.

MEMS microphone component 300 shown in FIG. 5 essentially has the same component structure as MEMS microphone component 200 described earlier in connection with FIG. 4. However, no hollow spaces are developed in semiconductor substrate 1 underneath bond pad 16 in this instance. Instead, an upper layer region of semiconductor substrate 1 was replaced by a dielectric material 30, here, an oxide of the semiconductor substrate. As a result, the distance between the electrodes of the parasitic capacitance, i.e., between bond pad 16 and substrate surface 31 underneath bond pad 16, has become larger, which has contributed to a reduction of the parasitic capacitance.

Figure 6A:
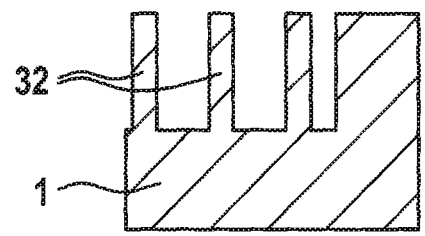
FIGS. 6a, 6b and 6c illustrate the manufacturing process of the MEMS microphone component 300 with the aid of schematic sectional views.
Figure 6A:
Figure 6B:
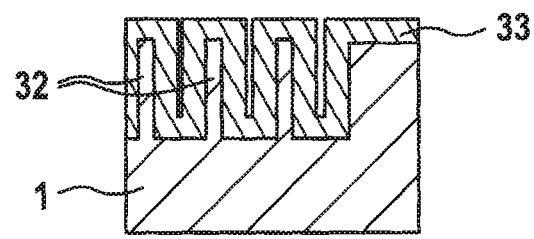
Figure 6B:
Figure 6C:
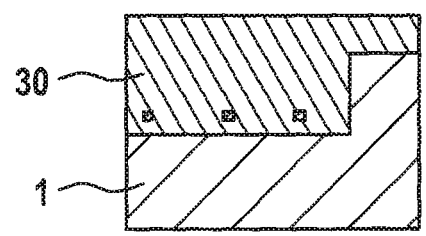

An especially simple option for creating an oxide region in a semiconductor substrate 1 is illustrated by FIGS. 6a through 6c. To do so, a raster-type structure 32 or a porosity is created in the affected surface region of semiconductor substrate 1 to begin with. Both the areal extension and the depth extension should roughly correspond to the desired dimensions of the oxide region to be produced. Semiconductor substrate 1 structured in this manner—FIG. 6a—is then subjected to an oxidation process, in which a surface oxide layer 33 forms at the outset—FIG. 6b—, but then the entire structured substrate material is converted into oxide 30—FIG. 6c.

Semiconductor substrate 1 prepared in this manner is then able to be used as initial substrate for the layer structure of MEMS microphone component 300 shown in FIG. 5.

Finally, it is also pointed out that the measures of the present invention for reducing the parasitic capacitance between a bond pad and an electrically conductive layer lying underneath may naturally also be used for a bond pad for the electrical contacting of the diaphragm electrode.

What is claimed is:

1. A capacitive MEMS sensor element, comprising:
a sensor structure having a capacitor and a bond pad realized in a layer structure on a semiconductor substrate, the capacitor including a deflectable electrode and a stationary counter electrode, the bond pad electrically contacting the counter electrode;
wherein a carrier layer is situated underneath the bond pad, the carrier layer including a region that is directly beneath the entire bond pad;
wherein the entire region of the carrier layer that is situated directly beneath the entire bond pad is a continuous, uninterrupted insulating material;
wherein the layer structure includes at least one insulation layer by which the bond pad is electrically insulated from an electrically conductive layer lying underneath the carrier layer; and
wherein the at least one insulation layer is situated underneath the carrier layer and is structured in a region below the bond pad, so that hollow spaces are situated directly underneath the bond pad in the layer structure via the structured region, by which a parasitic capacitance between the bond pad and the electrically conductive layer lying underneath is reduced.

2. The MEMS sensor element of claim 1, wherein the electrically conductive layer lying underneath the carrier layer is a functional layer of the layer structure, or the semiconductor substrate.

3. The MEMS sensor element of claim 1, wherein the at least one insulation layer is structured between the carrier layer and the electrically conductive layer.

4. The MEMS sensor element of claim 1, wherein the electrically conductive layer underneath the at least one insulation layer is structured.

5. The MEMS sensor element of claim 1, wherein at least two layers underneath the carrier layer are structured in at least one of different rasters and at an offset from each other.

6. The MEMS sensor element of claim 1, wherein the insulation layer includes at least one horizontal insulation structure and at least one vertical insulation structure;
wherein the at least one horizontal insulation structure is orientated at a right angle to the at least one vertical insulation structure; and
wherein the at least one horizontal insulation structure and the at least one vertical insulation structure form a web structure.

7. The MEMS sensor element of claim 1, wherein the insulation layer includes a first insulation structure and a second insulation structure;
wherein the first insulation structure is structured as a hollow, annular insulation structure having a center; and
wherein the second insulation structure is structured as a star-shaped insulation structure having a center that is concentric to the center of the first insulation structure.

8. The MEMS sensor element of claim 1, wherein the capacitor is a microphone.

9. The MEMS sensor element of claim 1, wherein the counter electrode is an acoustically permeable stationary counter element.

10. The MEMS sensor element of claim 1, wherein the deflectable electrode is an electrically conductive diaphragm for signal acquisition.

11. A capacitive MEMS sensor element, comprising:
a sensor structure having a capacitor and a bond pad realized in a layer structure on a semiconductor substrate, the capacitor including a deflectable electrode and a stationary counter electrode, the bond pad electrically contacting the counter electrode;

wherein a carrier layer is situated underneath the bond pad, the carrier layer including a region that is directly beneath the entire bond pad;

wherein the entire region of the carrier layer that is situated directly underneath the entire bond pad is a continuous, uninterrupted insulating material;

wherein the layer structure includes at least one insulation layer having an insulating material by which the bond pad is electrically insulated from an electrically conductive layer situated underneath the carrier layer; and wherein the insulating material of the at least one insulation layer is considerably thicker in a region directly underneath the bond pad than in a region outside the region directly underneath bond pad.

12. The MEMS sensor element of claim 11, wherein at least a portion of the electrically insulating material underneath this bond pad was created by oxidation of structured or porous substrate material.

13. The MEMS sensor element of claim 11, wherein the capacitor is a microphone.

14. The MEMS sensor element of claim 11, wherein the counter electrode is an acoustically permeable stationary counter element.

15. The MEMS sensor element of claim 11, wherein the deflectable electrode is an electrically conductive diaphragm for signal acquisition.

16. A capacitive MEMS microphone component, comprising:

a sensor structure having a capacitor and a bond pad realized in a layer structure on a semiconductor substrate, the capacitor including a deflectable electrode and a stationary counter electrode, the bond pad electrically contacting the counter electrode;

wherein a carrier layer is situated underneath the bond pad, the carrier layer including a region that is directly beneath the entire bond pad;

wherein the entire region of the carrier layer that is situated directly underneath the entire bond pad is a continuous, uninterrupted insulating material;

wherein the layer structure includes at least one insulation layer situated directly underneath the carrier layer, the at least one insulation layer electrically insulating the bond pad from an electrically conductive layer situated underneath the at least one insulation layer; and wherein the at least one insulation layer is structured so that hollow spaces are situated directly underneath the bond pad by which a parasitic capacitance between the bond pad and the electrically conductive layer lying underneath is reduced.

17. The MEMS sensor element of claim 16, wherein the counter electrode is an acoustically permeable stationary counter element.

18. The MEMS sensor element of claim 16, wherein the deflectable electrode is an electrically conductive diaphragm for signal acquisition.

* * * * *